(12) United States Patent
Nara (10) Patent No.: US 7,692,507 B2
(45) Date of Patent: Apr. 6, 2010

(54) APPARATUS AND METHOD OF GENERATING A PLURALITY OF SYNCHRONIZED RADIO FREQUENCY SIGNALS

(75) Inventor: Akira Nara, Tokyo (JP)

(73) Assignee: Tektronix, Inc., Beaverton, OR (US)

( * ) Notice: Subject to any disclaimer, the term of this patent is extended or adjusted under 35 U.S.C. 154(b) by 338 days.

(21) Appl. No.: 11/781,129

(22) Filed: Jul. 20, 2007

(65) Prior Publication Data

US 2008/0144595 A1 Jun. 19, 2008

(51) Int. Cl.
*H04L 27/20* (2006.01)

(52) U.S. Cl. ..................................... 332/103
(58) Field of Classification Search .......... 332/100–105
See application file for complete search history.

(56) References Cited

U.S. PATENT DOCUMENTS

| | | | |
|---|---|---|---|
| 5,295,138 A | 3/1994 | Greenberg et al. | |
| 5,430,711 A | 7/1995 | Yamada et al. | |
| 5,519,732 A * | 5/1996 | Chester | ...................... 375/295 |
| 5,608,724 A | 3/1997 | Green | |
| 5,825,829 A | 10/1998 | Borazjani et al. | |
| 6,161,004 A | 12/2000 | Galal et al. | |
| 6,891,904 B1 | 5/2005 | Okada | |
| 6,992,990 B2 | 1/2006 | Sakusabe | |

FOREIGN PATENT DOCUMENTS

| | | |
|---|---|---|
| DE | 10051671 A1 | 5/2002 |
| JP | H05-327563 | 12/1993 |
| JP | H11-205162 | 7/1999 |
| JP | 2001-203609 | 7/2001 |

* cited by examiner

*Primary Examiner*—David Mis
(74) *Attorney, Agent, or Firm*—Matthew D. Rabdau (57) ABSTRACT

A plurality of RF signals are generated with the RF signals synchronized with each other with high accuracy. Transmission data of the multiple channels are modulated, the modulated data of the channels are added to produce composite data and the composite data is stored in a data storage device. In the modulation process, the carrier frequencies are different from each other. The composite data comprises the data of the channels modulated in the frequency division multiplexing manner. The composite data is converted into an analog composite signal by a D/A converter and this analog signal is upconverted to an RF frequency by a frequency conversion circuit. A signal separation circuit produces two channel signals from the RF frequency signal. A signal output circuit generates the output signals having desired frequencies and signal levels.

5 Claims, 5 Drawing Sheets

APPARATUS AND METHOD OF GENERATING A PLURALITY OF SYNCHRONIZED RADIO FREQUENCY SIGNALS

BACKGROUND

Embodiments of the present invention relate to an apparatuses and methods of generating a plurality of channels of radio frequency signals that are precisely synchronized with each other.

In the past, a signal generator apparatus has been used to generate an RF (radio frequency) signal as a test signal in order to measure an operational property of a receiver used in a RF communication system. In this signal generator apparatus, transmission data is stored in a data storage device, this data being used to generate the RF signal. The transmission data stored in the data storage device is digitally modulated and a frequency of the modulated data is upconverted for outputting as the RF signal.

Figure 1:
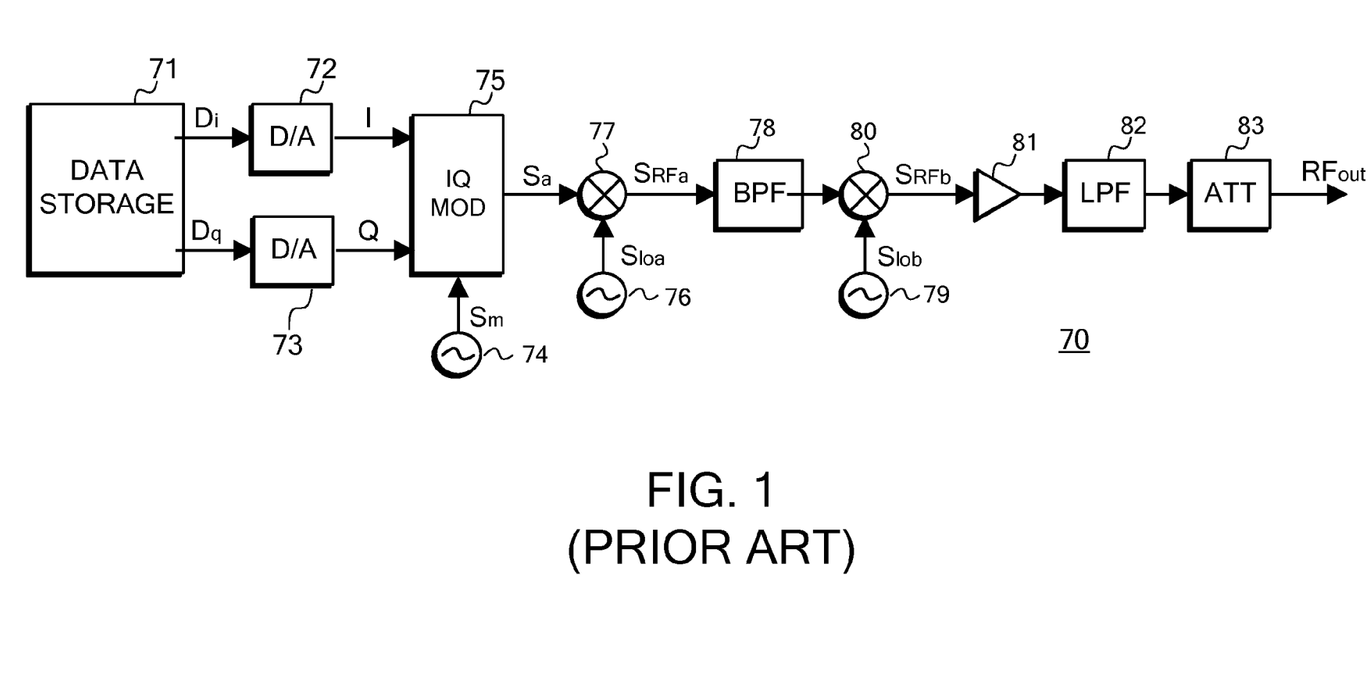
FIG. 1 (Prior Art) is a functional block diagram of a conventional signal generator apparatus.

FIG. 1 (Prior Art) shows a functional block diagram of a conventional signal generator apparatus 70. A data storage device 71 stores the transmission data to be used for generating the RF signal. When the signal generator apparatus 70 supplies the RF signal, the transmission data Di and Dq are read out from the data storage device 71, the transmission data Di is applied to a D/A converter 72 and the transmission data Dq is applied to a D/A converter 73.

The D/A converter 72 converts the transmission data Di into an analog baseband signal I and applies it to an IQ modulator 75. The D/A converter 73 converts the transmission data Dq into an analog baseband signal Q and applies it to the IQ modulator 75. A carrier wave signal generator 74 provides the IQ modulator 75 with a carrier wave signal Sm.

The IQ modulator 75 multiplies the carrier wave signal Sm and the baseband signal I to produce a modulated signal. In addition, the IQ modulator 75 shifts the phase of the carrier wave signal Sm by 90 degrees and multiplies the phase shifted carrier wave signal and the baseband signal Q to produce another modulated signal. These two modulated signals are added to each other to produce a modulated output signal Sa that is applied to a mixer 77.

A local oscillator 76 generates a local oscillation signal Sloa having a frequency higher than that of an output signal RFout from the signal generator apparatus 70. This local oscillation signal Sloa is applied to the mixer 77. The mixer 77 multiplies the modulated signal Sa and the local oscillation signal Sloa in order to upconvert the modulated signal Sa. The upconverted SRFa is applied to a bandpass filter (BPF) 78.

The bandpass filter 78 deletes an image component from the RF signal SRFa and applies its output to a mixer 80.

A local oscillator 79 oscillates a local oscillation signal Slob and applies this signal to the mixer 80. The local oscillator 79 can vary a frequency of the local oscillation signal Slob so that the frequency of the output signal RFout from the signal generator apparatus 70 can be varied.

The mixer 80 multiplies the RF signal SRFa and the local oscillation signal Slob to downconvert the frequency of the RF signal SRFa to a desired frequency. The signal SRFb of the desired frequency is applied from the mixer 80 through a power amplifier 81 to a lowpass filter (LPF) 82.

The lowpass filter 82 deletes an image component from the signal SRFb and applies its output to an attenuator 83. The attenuator 83 adjusts a level of the signal having no image to a desired signal level for producing the output signal RFout.

In the signal generator apparatus that generates the RF output signal by modulating the baseband signals I and Q and converting their frequencies, an offset phase loop is used for an envelop modulation of its output in order to generate a variable envelope wideband RF signal having a low noise as discussed in Japanese Unexamined Patent Publication No. 2001-45079. U.S. Pat. No. 4,843,351 discloses a signal generator apparatus having a high precision IQ (vector) modulation circuit.

The radio communication system uses the MIMO (Multiple Input Multiple Output) technology for increasing transmission speed. In the MIMO technology, a plurality of antennas transmits different data simultaneously and a receiver side restores the original signals from the interfered signals. According to the MIMO technology, a combination of antennas of a transmitter side and a receiver side is regarded as a virtual communication path. A transfer characteristic of each communication path is preliminarily evaluated, and the evaluated transfer characteristic is referred to when restoring the original signals from the interfered signals.

When different data are transmitted from multiple antennas simultaneously, the signal generator apparatus as shown in FIG. 1 is used at each antenna. For example, if two antennas transmit different data simultaneously, two signal generator apparatuses are required wherein a desired frequency output signal generated by one signal generator apparatus is transmitted via one antenna and another desired frequency output signal generated by the other one signal generator apparatus is transmitted via the other one antenna.

In a case that multiple signal generator apparatuses are used, if operation timing of the D/A converters 72, 73, the IQ modulators 75, etc. in one signal generator apparatus does not meet with that of other signal generator apparatus, a skew problem may occur and there is a possibility that the original signal cannot be restored. In order to synchronize the operations of the multiple signal generator apparatuses with each other, it is required to synchronize the clock signal for the D/A converters 72, 73, the local oscillation signals, etc. of one signal generator apparatus with those of other signal generator apparatus. For this, it is required that, for example, a sync signal is applied from one signal generator apparatus to the other signal generator apparatus so as to synchronize the clock signal, the local oscillation signal, etc. with the sync signal. Another approach is that a frequency synthesizer applies the sync signal to all the signal generator apparatuses so as to synchronize the clock signal, the local oscillation signal, etc. with the sync signal. Therefore, the radio communication system becomes complex in construction. Moreover, it is expensive to construct such a radio communication system.

Therefore, what is desired is a signal generator apparatus that generates a plurality of RF signals simply and inexpensively, the RF signals being synchronized with each other highly precisely.

SUMMARY

Accordingly, embodiments of the present invention provide an apparatus and method of generating a plurality of channels of radio frequency signals that are precisely synchronized with each other. An embodiment of a signal generator apparatus comprises data storage means for storing composite data, the composite data being obtained by modulating plural-channel transmission data for every channel and multiplexing the modulated data in a frequency division manner. The signal generator apparatus further comprises signal separating means for deriving the modulated data of each channel of an analog signal type from the composite data read out from the data storage means, and output processing means for converting a frequency of the modulated signal of each channel obtained by the signal separating means into a desired output frequency.

A signal generating method according to an embodiment of the present invention comprises a signal separation step for deriving modulated data for each channel as an analog signal from composite data that is produced by modulating multi-channel transmission data for every channel and by multiplexing the modulated data in a frequency division manner. This method further comprises an output processing step for converting a frequency of the modulated signal of each channel obtained by the signal separating step into a desired output frequency.

A data generator apparatus according to an embodiment of the present invention comprises modulation means for modulating a carrier wave with multi-channel transmission data to generate modulation data for every channel, and adder means for adding the modulation data of each channel obtained by the modulation means to generate composite data. The modulation means operates under a condition that the carrier wave frequency of one channel is different from that of other channels. The adder means generates the composite data by multiplexing the modulated data of each channel in a frequency division multiplexing manner.

A data generating method according to an embodiment of the present invention comprises a modulation step for modulating a carrier wave with multi-channel transmission data to generate modulation data for every channel; and an adding step for adding the modulated data of each channel obtained by the modulation means to generate composite data. The modulation step is under a condition that the carrier wave frequency of one channel is different from that of other channel. The adding step generates the composite data by multiplexing the modulation data of each channel in a frequency division multiplexing manner.

According to an embodiment of the present invention, the multi-channel transmission data are modulated and the modulated data of the channels are added to each other for generating the composite data. In the modulation process, the carrier wave frequency of one channel is different from that of other channel. The composite data is processed such that the modulated data of each channel is frequency division multiplexed. When generating the RF signal, the modulated signal of each channel is obtained as an analog signal from the composite data and a frequency of the modulated signal of each channel is converted to a desired frequency.

Therefore, it is not required to use multiple signal generation apparatuses and the synchronize these signal generation apparatuses with each other when generating the plurality of RF signals that are synchronized with high accuracy. In addition, embodiments of the present invention can reduce differences between multiple channels in terms of time propagation characteristics and a frequency propagation characteristics. Since the multi-channel output signals can be generated by common hardware, a cost for each channel can be reduced.

The objects, advantages and other novel features of the present invention are apparent from the following detailed description when read in conjunction with the appended claims and attached drawing.

DETAILED DESCRIPTION

Figure 2:
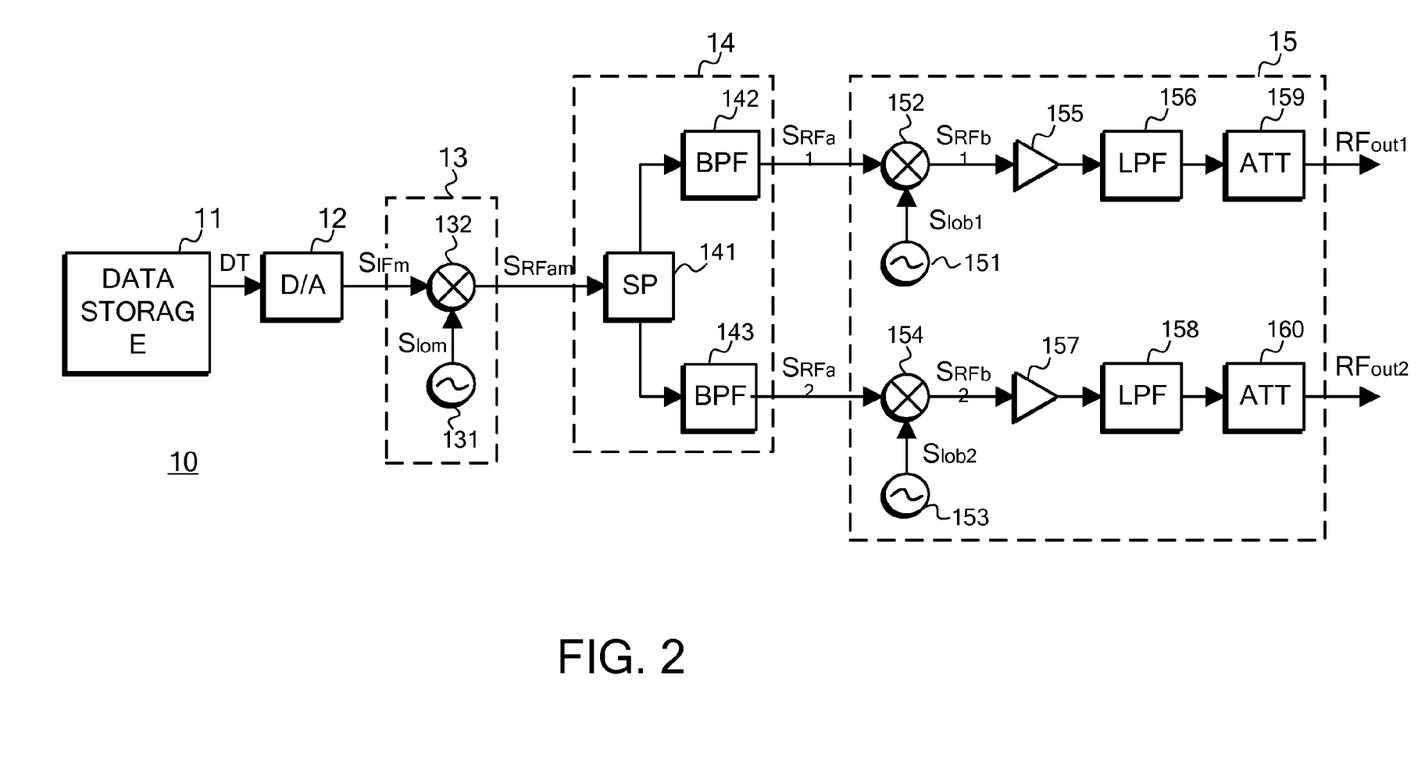
FIG. 2 is a functional block diagram of a signal generator apparatus according to an embodiment of the present invention.

One embodiment of the present invention will be discussed by reference to the drawings. FIG. 2 is a functional block diagram of the signal generator apparatus according to an embodiment of the present invention. As shown in FIG. 2, two synchronized output signals are produced.

A signal generator apparatus 10 comprises a data storage device 11 that may be a memory, etc. The data storage device 11 stores composite data DT to be used to generate two synchronized output signals (hereinafter refer to "first and second channel output signals"). When the signal generator apparatus 10 generates the first and second channel output signals, the stored composite data DT is applied to a D/A converter 12. The D/A converter 12 converts the composite data DT into an analog composite signal SIFm that is applied to a mixer 132 of a frequency conversion circuit 13.

The frequency conversion circuit 13 upconverts the frequency of the composite signal SIFm such that an image component can be easily removed even if the frequencies of the first channel output signal RFout1 and the second channel output signal RFout2 are changed when a signal output circuit 15 generates the first and second channel output signals RFout1 and RFout2, which will be described hereinafter.

A local oscillator 131 of the frequency conversion circuit 13 produces a local oscillation signal Slom that is applied to the mixer 132. The frequency of the local oscillation signal Slom is set to, for example, a frequency higher than the frequencies of the first and second channel output signals RFout1 and RFout2. According to this setting, the frequency conversion operation by mixers 152, 154 (will be described hereinafter) makes the frequencies of the image components higher than the frequencies of the first and second channel output signals RFout1 and RFout2. As a result, lowpass filters 156 and 158 can remove the image components easily.

The mixer 132 multiplies the composite signal SIFm by the local oscillation signal Slom so as to upconvert the composite signal SIFm. The produced RF signal SRFam is applied to a signal separation circuit 14. This signal separation circuit 14 obtains the first channel modulated signal and the second channel modulated signal.

A splitter 141 in the signal separation circuit 14 applies the RF signal SRam1 from the frequency conversion circuit 13 to bandpass filters 142 and 143.

The passing frequency band of the bandpass filter 142 is different from that of the bandpass filter 143. The bandpass filter 142 passes the modulated signal component for producing the first channel output signal RFout1 and the passed signal is applied as the first channel RF signal SRFa1 to a signal output circuit 15. The bandpass filter 143 passes the modulated signal component for producing the second channel output signal RFout2 and the passed signal is applied as the second channel RF signal SRFa2 to the signal output circuit 15. The signal output circuit 15 is to convert the frequencies of the first and second channel signals from the signal separation circuit 14 into desired output frequencies.

In the signal output circuit 15, a local oscillator 151 oscillates a local oscillation signal Slob1 that is applied to a mixer 152. A local oscillator 153 oscillates a local oscillation signal Slob2 that is applied to a mixer 154. These local oscillators 151 and 153 are configured to vary the frequencies of the local oscillation signals Slob1 and Slob2 so that the frequencies of the output signals RFout1 and RFout2 from the signal generator apparatus 10 can be changed.

The mixer 152 multiplies the first channel RF signal SRFa1 from the signal separation circuit 14 and the local oscillation signal Slob1 from the local oscillator 151 so as to downconvert the first channel RF signal SRFa1. Therefore, the mixer 152 generates the first channel signal SRFb 1 of the desired frequency that is applied through a power amplifier 155 to a lowpass filter 156.

The mixer 154 multiplies the second channel RF signal SRFa2 from the signal separation circuit 1 and the local oscillation signal Slob2 from the local oscillator 153 so as to downconvert the second channel RF signal SRFa2. Therefore, the mixer 154 generates the second channel signal SRFb2 of the desired frequency and applies it through a power amplifier 157 to a lowpass filter 158.

The lowpass filter 156 removes the image component from the first channel signal SRFb1 and applies its output to an attenuator 159. The attenuator 159 adjusts the level of first channel signal having no the image component to a desired signal level and then produces the first channel output signal RFout1.

The lowpass filter 158 removes the image component from the second channel signal SRFb2 and applies its output to an attenuator 160. The attenuator 160 adjusts the level of the second channel signal having no image component to a desired signal level and then produces the second channel output signal RFout2.

The composite data DT to be stored in the data storage device 11 is generated by a data generator apparatus 40 that will be discussed hereinafter. This data generator apparatus 40 modulates digitally the transmission data DU1 and DU2 that are used for generating the first and second channel output signals RFout1 and RFout2 respectively. These transmission data DU1 and DU2 are multiplexed in the frequency division multiplexing manner to generate the composite data DT.

Figure 3:
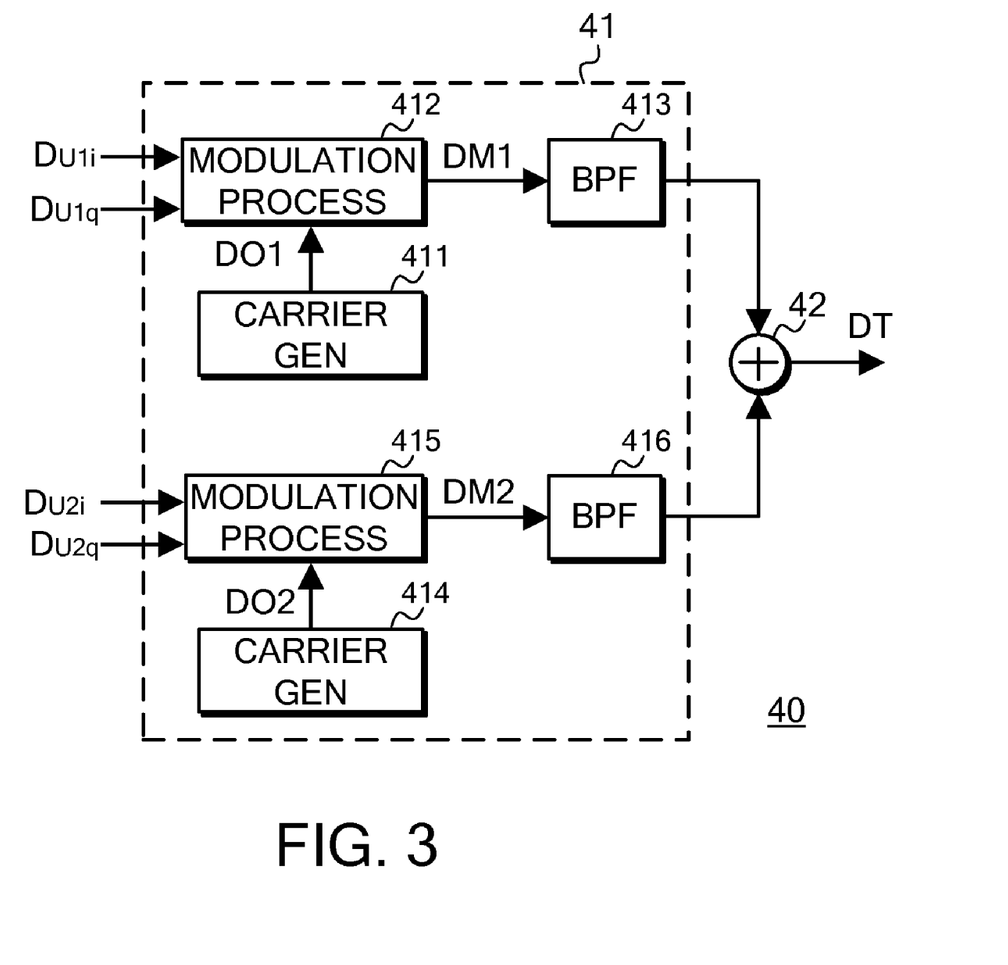
FIG. 3 is a functional block diagram of a data generator apparatus according to an embodiment of the present invention.

FIG. 3 shows a functional block diagram of the data generator apparatus 40 according to the present invention. The transmission data DU1 includes IQ data DU1$i$ and DU1$q$ that are applied to a digital modulator 41. Similarly, the transmission data DU2 includes IQ data DU2$i$ and DU2$q$ that are applied to the digital modulator 41, too. These data are the same as data used in a conventional signal generator apparatus, however, an embodiment of the present invention uses the data for the multiple channels. These data may be previously stored in a memory (not shown).

The digital modulator 41 and an adder 42 may be typically accomplished by a digital signal processor (DSP) where each block function in FIG. 3 can be realized by the operation of the DSP. Alternatively, each block can be accomplished by dedicated hardware. A carrier wave generator 411 in the digital modulator 41 generates a carrier wave data DO1 that is applied to a modulation processing circuit 412.

The modulation processing circuit 412 executes a modulation operation by using the transmission data DU1$i$ and DU1$q$ and the carrier wave data DO1 to generate the first channel modulated data DM1 that is applied to a bandpass filter 413.

For example, in the IQ modulation by the modulation processing circuit 412, the carrier wave generator 411 applies the carrier wave data DO1 having the carrier wave data DO1$i$ and DO1$q$ to the modulation processing circuit 412. The carrier wave data DO1$i$ is representative of the digital data of the carrier wave signal Smd1 and the carrier wave data DO1$q$ is representative of the digital data of the 90-degree phase shifted version of the carrier wave signal Smd1. The modulation processing circuit 412 multiplies the transmission data DU1$i$ and the carrier wave data DO1$i$ to generate the modulated data DM1$i$. Similarly, the transmission data DU1$q$ and the carrier data DO1$q$ are multiplied to produce the modulated data DM1$q$. The modulated data DM1$i$ and the modulated data DM1$q$ are added to generate the first channel modulated data DM1.

A bandpass filter 413 removes unnecessary frequency components from the first channel modulated data DM1 and applies its output to an adder 42.

A carrier wave generator 414 generates carrier wave data DO2 and applies it to a modulation processing circuit 415.

Similarly to the modulation processing circuit 412, the modulation processing circuit 415 operates by using the transmission data DU2$i$ and DU2$q$ and the carrier wave data DO2 to produce the second channel modulated data DM2 that is applied to a bandpass filter 416.

The bandpass filter 416 removes the unnecessary frequency components from the second channel modulated data DM2 and applies its output to the adder 42.

The carrier wave generators 411 and 414 adjust the carrier wave frequencies differently as described in detail by reference to FIG. 4 so as to obtained the analog modulated signal based on the first channel modulated data DM1 and the analog modulated signal based on the second channel modulated data DM2 independently when the adder 42 adds the first and second channel modulated data DM1 and DM2.

The adder 42 adds the first and second channel modulated data DM1 and DM2 to produce the composite data DT that is stored in the data storage device 11. In this case, the composite data DT contains the multi-channel modulated transmission data that are the frequency division multiplexed data where each channel frequency band does not overlap with each other.

In another embodiment of the data generator apparatus 40 according to the present invention, the transmission data and the analog carrier wave signal may be multiplied by every channel, the analog modulated signals may be added to each other and the added analog output may be converted into a digital format to produce the composite data DT.

The operation of the signal generator apparatus and the data generator apparatus will be discussed. For ease of understanding, the operation of the data generator apparatus will be explained first and then the operation of the signal generator apparatus will be discussed.

Figure 4:
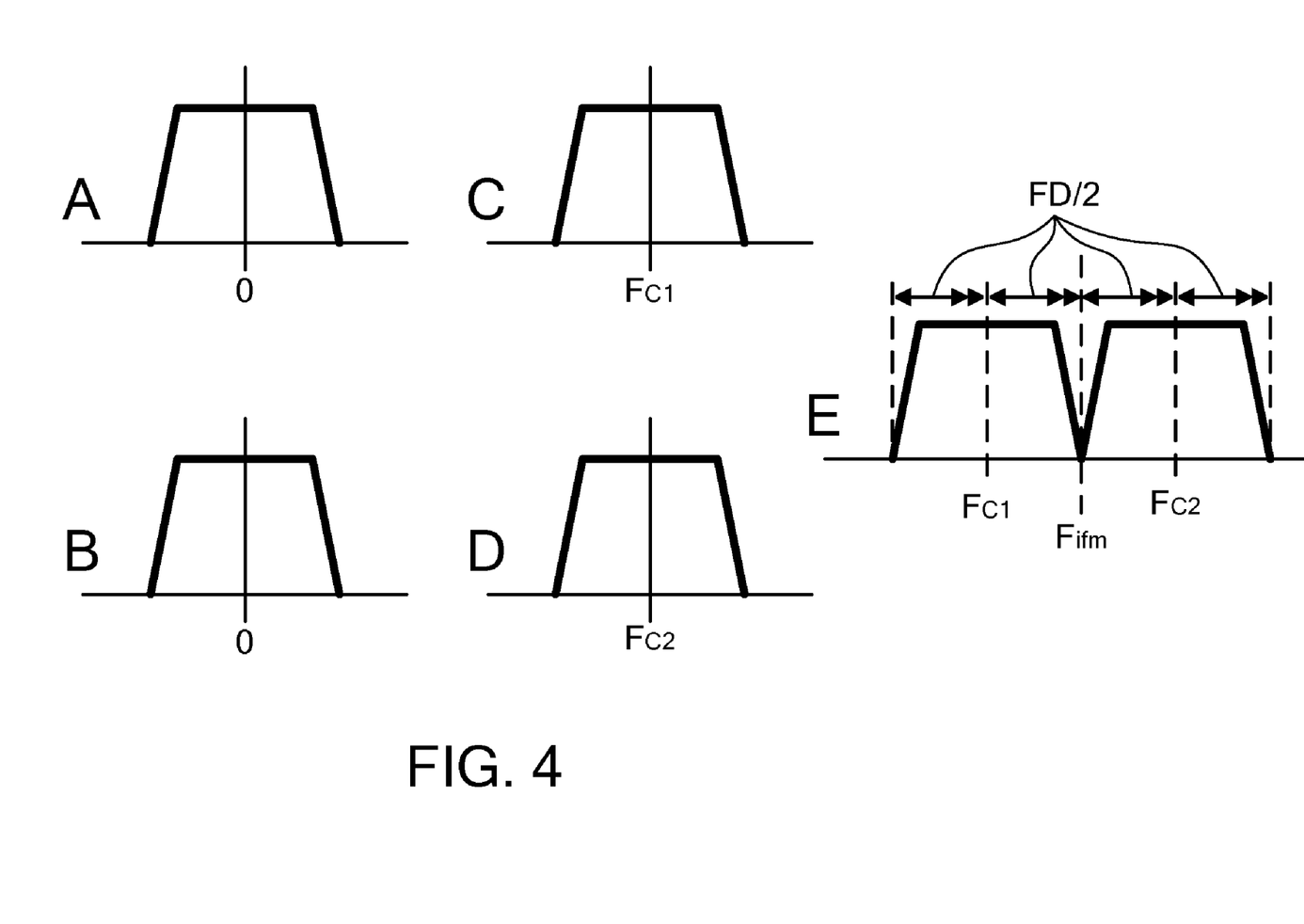
FIG. 4 is a drawing for explaining the operation of the data generator apparatus shown in FIG. 3.
Figure 5:
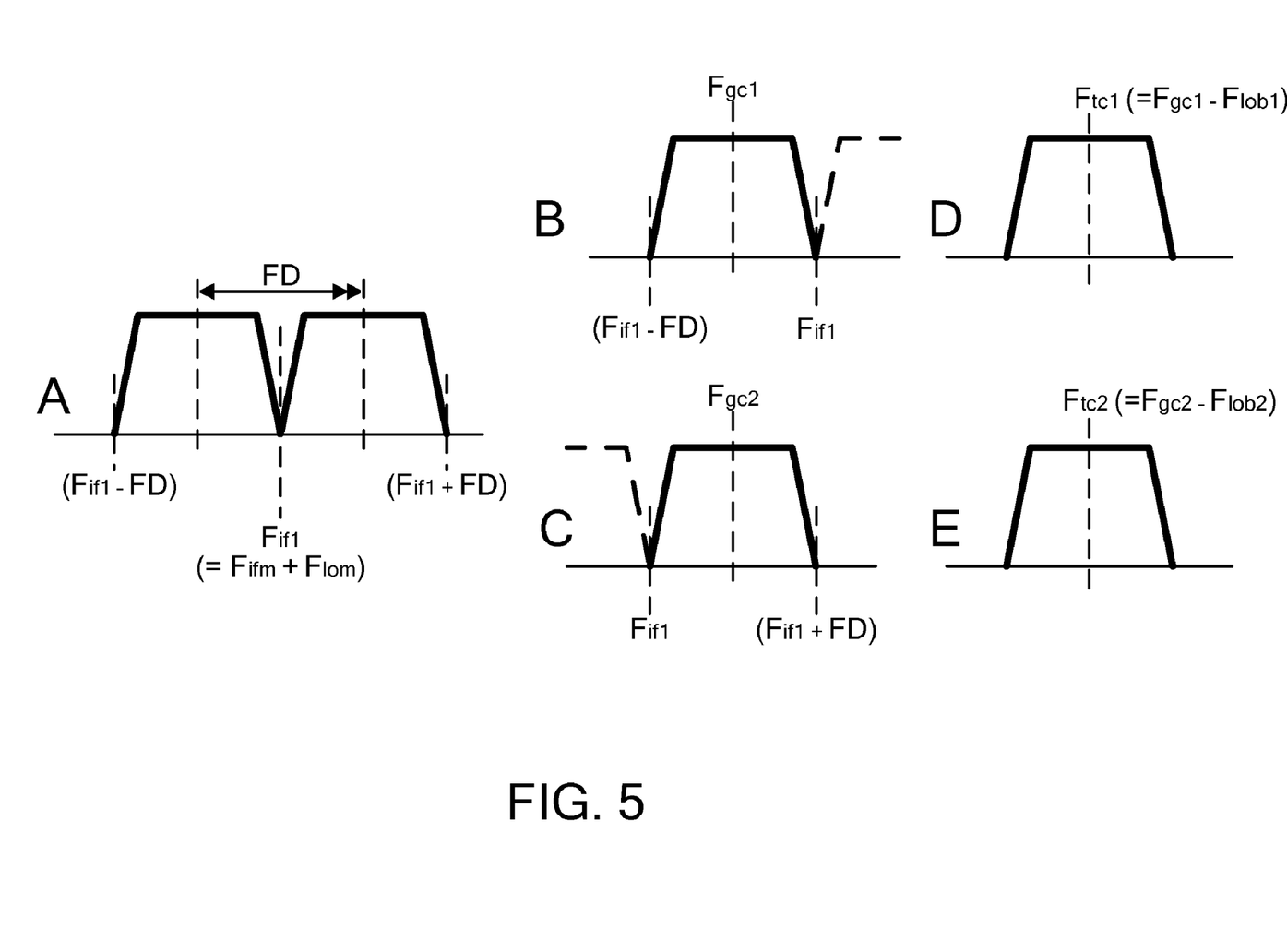
FIG. 5 is a drawing for explaining the operation of the signal generator apparatus shown in FIG. 2.

FIG. 4 shows a model of a frequency spectrum in order to explain the operation of the data generator apparatus. In FIG. 4 and FIG. 5 (that will be discussed hereinafter), harmonic components and image components are not shown.

FIG. 4A shows a frequency spectrum of the transmission data DU1$i$ and DU1$q$ applied to the modulation processing circuit 412 of the digital modulator 41. The modulation processing circuit 412 operates by using the transmission data DU1$i$ and DU1$q$ and the carrier wave data DO1 to generate the first channel modulated data DM1. If the carrier wave data DO1 is the digital data of the carrier wave signal having the frequency Fc1, FIG. 4C shows the frequency spectrum of the first channel modulation data DM1 generated by the modulation processing circuit 412.

Similarly, FIG. 4B shows a frequency spectrum of the transmission data DU2$i$ and DU2$q$ applied to the modulation processing circuit 415. The modulation processing circuit 415 operates by using the transmission data DU2$i$ and DU2$q$ and the carrier wave data DO2 so as to generate the second channel modulated data DM2. If the carrier wave data DO2 is the digital data of the carrier wave signal having the frequency Fc2, FIG. 4D shows the frequency spectrum of the second channel modulation data DM2 generated by the modulation processing circuit 415.

If the frequency Fc1 is set to "Fc1=Fifm−FD/2" and the frequency Fc2 is set to "Fc2=Fifm+FD/2", the frequency spectrum of the composite data DT is shown in FIG. 4E wherein the frequency band of the first channel modulation data DM1 does not overlap with that of the second channel modulation data DM2. "Fifm" is an intermediate frequency and is, for example, "Fifm=(Fc1+Fc2)/2". "FD" is a bandwidth that is calculated from "FD=Fbw+2Ftc" where "Fbw" is the bandwidth of the transmission data and "Ftc" is a transition band of the bandpass filters 144 and 143.

As described hereinbefore, the composite data DT is the multiplexed data of the modulated data component obtained by modulating the transmission data DU1 of the first channel and the modulated data component obtained by modulating the transmission data DU2 of the second channel, wherein the frequencies of these modulated data components do not overlap with each other. The data storage device 11 of the signal generator apparatus 10 stores the composite data DT produced by the frequency division multiplexing operation of the modulated data of the two channels.

FIG. 5 shows a frequency spectrum model for explaining the operation of the signal generator apparatus. The composite data DT stored in the data storage device 11 is converted into the analog composite signal SIFm by the D/A converter 12 and is multiplied with the local oscillation signal Slom. If the frequency of the local oscillation signal Slom is Flom, the frequency spectrum of the RF signal SRFam from the frequency conversion circuit 13 is shown in FIG. 5A.

The bandpass filter 142 of the signal separation circuit 14 passes the frequency components based on the transmission data DU1, namely, the band from the frequency (Fif1−FD) to the frequency (=Fifm+Flom) so as to generate the first channel output signal RFout1. Therefore, the frequency spectrum of the first channel RF signal SRFa1 from the bandpass filter 142 is shown in FIG. 5B. The center frequency Fgc1 of the first channel RF signal SRFa1 is "Fgc1=Fif1−FD/2". A dotted line represents the removed signal components.

The bandpass filter 143 passes the frequency components based on the transmission data DU2, namely, the band from the frequency Fif1 to the frequency (Fifm+FD) so as to generate the second channel output signal RFout2. Therefore, the frequency spectrum of the second channel RF signal SRFa2 from the bandpass filter 143 is shown in FIG. 5C. The center frequency Fgc2 of the second channel RF signal SRFa2 is "Fgc2=Fif1+FD/2". A dotted line represents the removed signal components.

FIG. 5D shows a frequency spectrum of the first channel output signal RFout1. This signal RFout1 is generated by multiplying the first channel RF signal SRFa1 and the local oscillation signal Slob1 of the frequency Flob1 with the mixer 152 of the signal output circuit 15 and then by processing the multiplied result with the lowpass filter 156. The center frequency Ftc1 of the first channel output signal RFout1 is "Ftc1=Fgc1−Flob1".

FIG. 5E shows a frequency spectrum of the second channel output signal RFout2. This signal RFout2 is generated by multiplying the second channel RF signal SRFa2 and the local oscillation signal Slob2 of the frequency Flob2 with the mixer 154 and then by processing the multiplied result with the lowpass filter 158. The center frequency Ftc2 of the second channel output signal RFout2 is "Ftc2=Fgc2−Flob2".

As described hereinbefore, the frequency of the first channel output signal RFout1 depends on the frequency Flob1 of the local oscillation signal Slob1 and the frequency of the second channel output signal RFout2 depends on the frequency Flob2 of the local oscillation signal Slob2. By adjusting the frequencies of the local oscillation signals Slob1 and Slob2, the frequencies of the first and second channel output signals RFout1 and RFout2 can be adjusted independently. In addition, the frequency of the first channel output signal RFout1 can be easily adjusted to be equal to that of the second channel output signal RFout2.

Assuming that, for example, the carrier wave data DO1's frequency is Fc1=100 MHz and the local oscillator 131's oscillation frequency is Flom=3.9 GHz, if the bandpass filter 142 passes 4 GHz signal, the first channel RF signal SRFa1 can be obtained wherein the image component of 3.8 GHz is deleted. If the frequency Flob1 of the local oscillation signal Slob1 is varied within a range of 1 GHz to 3 GHz and this signal is multiplied by the first channel RF signal SRFa1 for the downconversion, the signal components of 1 GHz to 3 GHz and the signal components of 5 GHz to 7 GHz are produced from the first channel signal SRFb1. Since the lowpass filter 156 passes only the signal components of 1 GHz to 3 GHa, the center output frequency of the first channel output signal RFout1 can be varied in the range of 1 GHz to 3 GHz. By making the frequency of the frequency Flom higher than the output frequency of the first channel output signal RFout1, the frequency of the image component (5 GHz to 7 GHz) becomes far from the signal component of the first channel output signal RFout1 (1 GHz to 3 GHz). Therefore, the lowpass filters 156 and 158 can easily remove the image components (5 GHz to 7 GHz in this example) because of no interference. The center output frequency of the second channel output signal RFout2 can be changed by a similar operation.

If the data generator apparatus 40 produces many composite data DT with many kinds of digital modulations and the data storage device 11 stores the produced composite data DT, the signal generator apparatus 10 can generate the synchronized multi-channel output signals of many kinds of digital modulations only by selecting one of many composite data DT read out from the data storage device 11. It is possible to generate the output signals whose digital modulation types are different in each channel.

In the signal generator apparatus 10 shown in FIG. 2, two channel output signals are generated. However, it is possible to generate more two synchronized output signals if the data generator apparatus 40 generates the composite data DT by the frequency division multiplexing operation of more two modulated data, wherein the signal generator apparatus 10 generates the analog signals of the modulated signals for the plural channels in accordance with the composite data DT and then converts the analog signals to desired frequencies.

In the signal generator apparatus 10 shown in FIG. 2, the frequency conversion circuit 13 removes the images by using the lowpass filters 156 and 158 when varying the frequencies of the first and second channel output signals Rfout1 and RFout2. In a case that the frequencies of the first and second channel output signal RFout1 and RFout2 are fixed, or in a case that the frequency variable range is narrow and the image components do not overlap with the signal components of the first and second channel output signals RFout1 and Rfout2, the plural-channel synchronized output signals can be generated without providing the frequency conversion circuit 13.

As described herein above, the transmission data of the multiple channels are processed in the frequency division multiplexing manner to produce the composite data and the produced composite data are stored in the data storage device. When generating the output signals of the multiple channels in synchronism with each other, the composite data is read out from the data storage device and the modulated signal of each channel is obtained by the processing operation. Then, the modulated signal is converted into the desired frequency. Therefore, the multiple channel output signals can be generated in a simple and low cost way, where these output signals are synchronized with each other with high accuracy. Since the output signal of each channel is produced from the composite data, mismatch of the time transmission characteristic and the frequency transmission characteristic can be reduced. Since the frequency band of the data to be processed by the D/A converter 12 is much lower than the operation frequency of existing D/A converter, the existing D/A converter is still available to the wider band for a larger number of the channels.

What is claimed is:

1. A signal generator apparatus, comprising:
   data storage device storing composite data, the composite data being obtained by modulating plural-channel transmission data of each channel and multiplexing the modulated data in a frequency division multiplexing manner;
   signal separation circuit connected to the data storage device, whereby the signal separation circuit derives the modulated data of each channel as an analog signal from the composite data read out from said data storage device; and
   signal output circuit connected to the signal separating means, wherein the signal output circuit converts a frequency of the modulated signal of each channel obtained by said signal separating circuit into a desired output frequency.

2. The signal generator apparatus as recited in claim 1, further comprising:
   A frequency converter to convert the frequency of the modulated signal obtained by said signal separating circuit into a frequency higher than the output frequency; wherein said signal output circuit includes filters to delete an image component generated in the frequency conversion by said signal output circuit.

3. A signal generating method, comprising the steps of:
   deriving modulated data of each channel as an analog signal from composite data, the composite data being obtained by modulating plural-channel transmission data of each channel and multiplexing the modulated data in a frequency division multiplexing manner; and
   converting a frequency of the modulated signal of each channel obtained by said signal separating step into a desired output frequency.

4. A data generator apparatus, comprising:
   modulation means for modulating a carrier wave with plural-channel transmission data to generate modulated data every channel; and
   adding means for adding the modulation data of each channel obtained by said modulation means to generate composite data;
   wherein said modulation means operates under a condition that frequencies of the carrier waves are different from each other, and said adding means generates the composite data by a frequency division multiplexing manner for the modulation data of each channel.

5. A data generating method, comprising the steps of:
   modulating a carrier wave with plural-channel transmission data to generate modulated data for each channel; and
   adding the modulated data of each channel obtained by said modulation step to generate composite data;
   wherein said modulation step is under a condition that frequencies of the carrier waves are different from each other, and said adding step generates the composite data by a frequency division multiplexing manner of the modulation data of each channel.

\* \* \* \* \*